United States Patent
Huemoeller

(12) 
(10) Patent No.: US 6,448,509 B1
(45) Date of Patent: Sep. 10, 2002

(54) PRINTED CIRCUIT BOARD WITH HEAT SPREADER AND METHOD OF MAKING

(75) Inventor: Ronald P. Huemoeller, Chandler, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/505,395

(22) Filed: Feb. 16, 2000

(51) Int. Cl.[7] ............................. H01R 12/04; H05K 1/11
(52) U.S. Cl. .......................................... 174/262; 29/830
(58) Field of Search ..................... 174/262–265; 29/830

(56) References Cited

U.S. PATENT DOCUMENTS

| | | | |
|---|---|---|---|
| 3,791,858 A | * 2/1974 | McPherson et al. | 117/201 |
| 3,873,756 A | * 3/1975 | Gall et al. | 174/68.5 |
| 3,934,334 A | * 1/1976 | Hanni | 29/625 |
| 4,362,899 A | * 12/1982 | Borrill | 174/36 |
| 5,650,593 A | 7/1997 | McMillan et al. | 174/52.4 |
| 5,949,030 A | * 9/1999 | Fasano et al. | 174/262 |
| 6,013,588 A | * 1/2000 | Ozaki | 442/179 |

FOREIGN PATENT DOCUMENTS

EP 0692823 A1 1/1996
EP 0 692 823 A1 1/1996

OTHER PUBLICATIONS

Hundt, Mike, et al., "Conduction–Cooled Ball Grid Array", '95 Flip Chip, BGA, TAB & AP Symposium, pp. 101–106.

* cited by examiner

Primary Examiner—Kamand Cuneo
Assistant Examiner—Jeremy Norris
(74) Attorney, Agent, or Firm—Skjerven Morrill LLP; James E. Parsons; Don Lawrence

(57) ABSTRACT

A method of making a PCB having an integral heat spreader and/or central ground plane includes forming one or more first openings in a first layer of a metal at selected locations and filling the openings with an electrically insulating material. The first sheet is laminated between second and third layers of a metal interleaved with first and second layers of a dielectric material. At least one second opening is formed through the insulating material in one of the first openings, and at least one third opening is formed in the laminate at a position displaced from the first openings. The upper and lower layers of metal are electrically connected to each other through the at least one second and third openings to define "vias" through the laminate. The vias comprise "clearance vias" from which the first metal sheet is electrically isolated, and "thermal vias" to which the first metal sheet is electrically connected. The thermally enhanced PCB is fabricated using only conventional PCB fabrication techniques.

25 Claims, 3 Drawing Sheets

PRINTED CIRCUIT BOARD WITH HEAT SPREADER AND METHOD OF MAKING

BACKGROUND

1. Field of the Invention

This invention relates to printed circuit boards ("PCBs") in general, and in particular, to a PCB with an integral heat spreader for use in semiconductor packages and a method of making such a PCB.

2. Description of the Related Art

To be practically useful, semiconductor chips are typically housed in robust packages that protect them from the environment, permit them to be reliably interconnected with associated components, and enable them to effectively dissipate heat to the ambient.

The current trend toward electronic devices that are more compact, yet faster and more functional, has created a corresponding demand for semiconductor packages that are smaller, yet which permit a more dense mounting of components dissipating greater amounts of heat. One response to this demand has been the development of so-called ball grid array ("BGA"), land grid array ("LGA"), and lead-less chip carrier ("LCC") types of packages that substitute lands or balls of solder on the bottom of the package for conventional leads. Such packages surface mount with a "footprint" that is the same size as the package itself. To accommodate chips dissipating greater amounts of power, special "power" versions of these packages (e.g., "PBGA" packages) have been developed. These typically involve mounting the chip(s), directly or indirectly on a heat sink, or "slug," that is laminated or soldered to the top or bottom side of an interconnection substrate, such as a PCB.

In a paper presented at the "'95 Flip Chip, BAG, TAB & AP Symposium," entitled, "Conduction-Cooled Ball Grid Array," (® 1995 Semiconductor Technology Center, Inc.), M. Hundt, et al. of SGS-Thomson Microelectronics, Inc., describe a BGA package in which a copper heat sink, or "slug," is laminated to the bottom surface (i.e., the surface on which the solder balls mount) of a PCB having a central rectangular opening in it. A chip is epoxied to the slug in the opening and is wire-bonded to the surrounding PCB substrate to effect electrical interconnection of the chip. The bottom surface of the heat slug is soldered to a multilayer main board having a relatively thick ground plane. Plated-through via holes in the main board conduct heat from the bottom of the heat slug to the ground plane to convey heat away from the chip. The authors claim that this design reduces the internal thermal resistance ($\Theta_{jc}$) of the package to a value that is typically less than 1 degree C/Watt for most sizes of chip.

While the foregoing type of package provides one solution to the problem of packaging chips dissipating larger amounts of heat in smaller packages, its benefits are somewhat offset in a cost-competitive environment by the additional costs associated with the fabrication and assembly of the special PCB and separate heat sink. A long-felt need therefore exists in the industry for a PCB having an enhanced heat dissipating capability for use in a power version of a BGA-, LGA- and LCC-type of semiconductor package.

BRIEF SUMMARY OF THE INVENTION

This invention provides a method of making a low-cost PCB having an integral heat spreader for use in a PBGA-, PLGA- or PLCC-type of semiconductor package that uses only conventional PCB fabrication methods and materials.

The method includes forming one or more clearance openings through a first layer of a metal at selected locations therein corresponding to the desired locations in the PCB of "clearance vias," i.e., locations where it is desired to conduct an electrical signal from the upper surface of the PCB to its lower surface. A lay-up is then formed in which the first layer of metal becomes the central layer of a "sandwich" respectively comprising a lower layer of a metal, a lower layer of a dielectric material, the first, or central layer of metal, an upper layer of a dielectric material, and an upper layer of a metal.

In one embodiment of the PCB, the dielectric layers comprise a composite of a fibrous dielectric material impregnated with a partially cured thermosetting resin. The lay-up is simultaneously pressed and heated between the platen of a heated press. The pressure forces some of the soft resin from the dielectric layers into the clearance openings in the central layer of metal, and some of the resin to the surfaces of the dielectric layers, where the resin wets the opposing surfaces of the respective metal layers. The heat cures the resin, simultaneously forming a resin insulator within each of the clearance openings and adhering the layers of the lay-up together in an integral laminate.

A plurality of apertures is formed through the laminate, and the interior walls of each aperture is plated with a metal to form a "via" in the laminate, i.e., a continuous metal path through the aperture between the upper and lower layers of metal. The "clearance vias" are created by forming selected ones of the apertures at the locations of the clearance openings, such that the central layer of metal is isolated from the metal paths through the apertures by the insulators in the clearance openings.

The remaining apertures are formed at locations other than those of the clearance openings, such that the central layer of metal is integrally connected to the metal paths through the selected apertures. These apertures correspond to "thermal vias," i.e., locations in the PCB, such as immediately below a semiconductor chip, where it is desirable to conduct heat from the upper layer of metal to the central layer, which acts as a "heat spreader" to spread the heat throughout the length and breadth of the PCB, and thence to the lower layer of metal, where it can be conducted away into, e.g., a heat-sinking "main board" to which the package is mounted.

A better understanding of the above and other features and advantages of the present invention may be obtained from a consideration of the detailed description below of the exemplary embodiments thereof, particularly if such consideration is made in conjunction with the associated drawings.

DETAILED DESCRIPTION OF THE EXEMPLARY EMBODIMENTS

Figure 1:
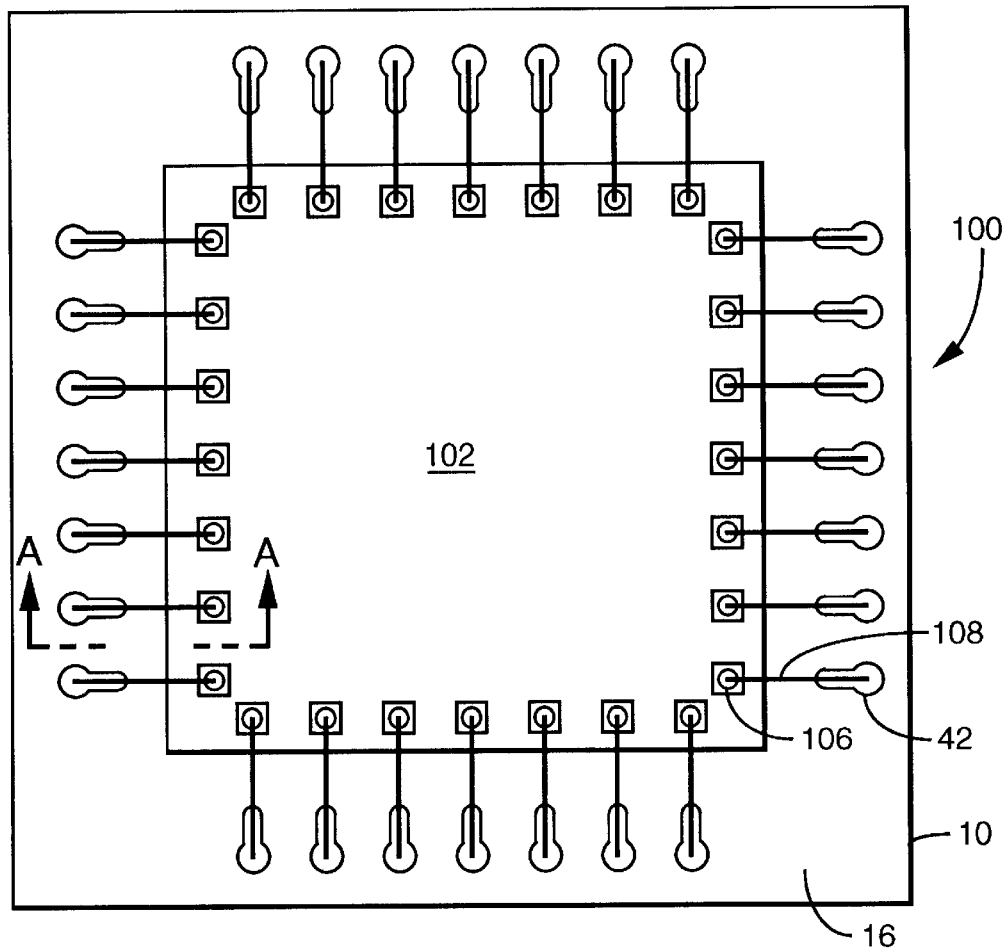
FIG. 1 is top plan view of a PBGA-type of semiconductor package incorporating a semiconductor chip and a PCB with a heat spreader in accordance with one embodiment of the present invention.
Figure 2:
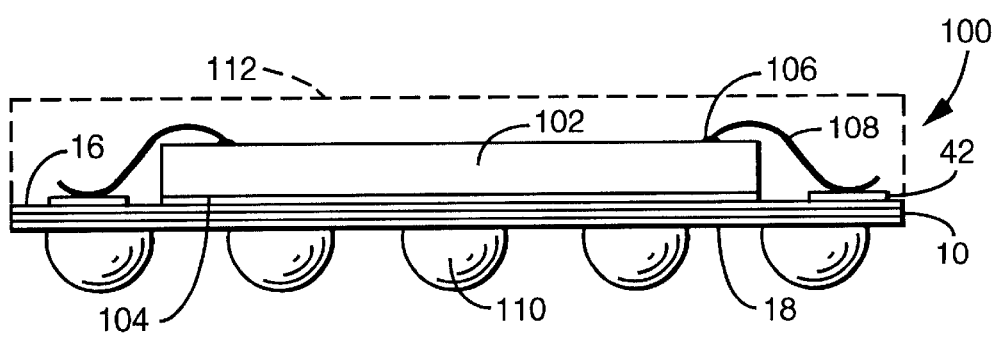
FIG. 2 is a side elevation view of the PBGA semiconductor package shown in FIG. 1.
Figure 3:
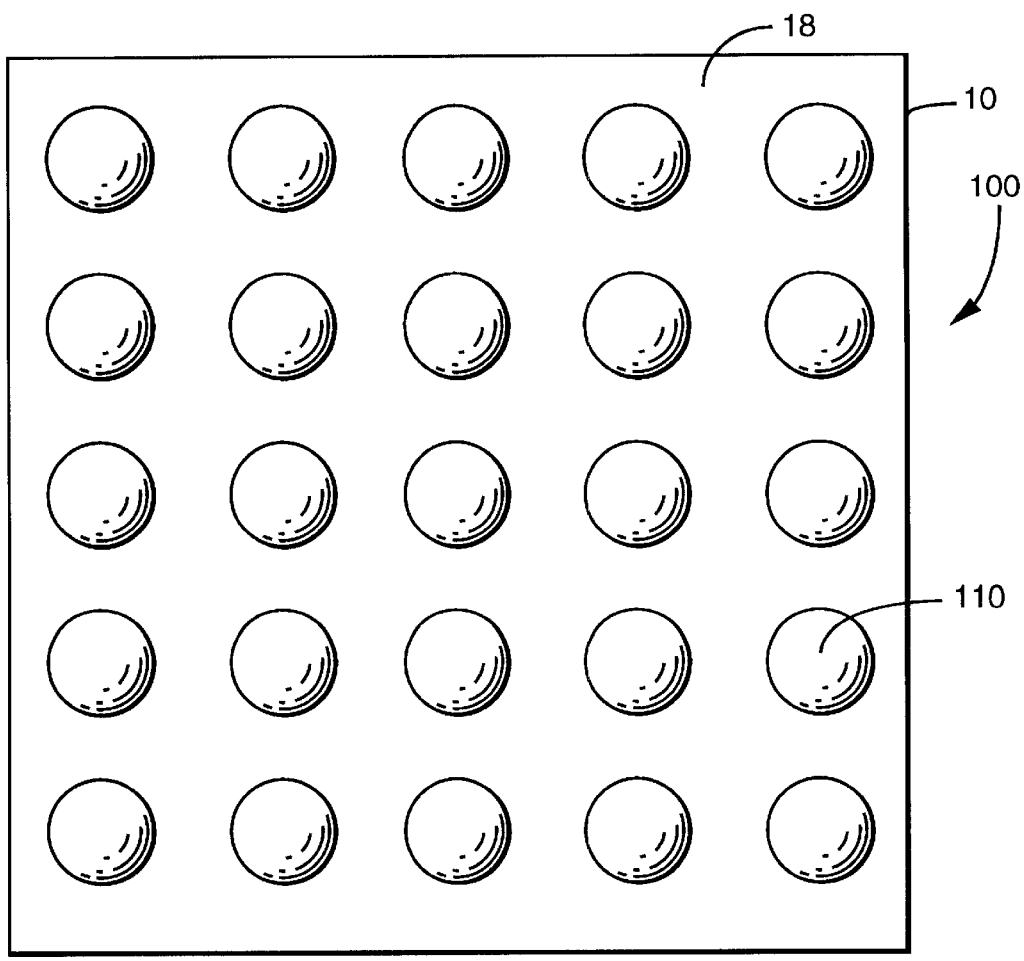
FIG. 3 is a bottom plan view of the PBGA semiconductor package shown in FIGS. 1 and 2; and, FIGS. 4–7 are cross-sectional elevation views looking into the PBGA package of FIGS. 1–3 along the lines A—A in FIG. 1, showing sequential stages during its fabrication.

An exemplary embodiment of a PCB 10 with a heat spreader 12 in accordance with the present invention is illustrated in the context of a PBGA-type of semiconductor package 100 in FIGS. 1–3. In the exemplary embodiment, a semiconductor die, or "chip" 102, is shown attached to the upper surface 16 of the PCB 10 with, e.g., a layer 104 of solder or a filled epoxy (see also FIG. 7).

Die pads 106 on the chip 102 are electrically connected to corresponding pads 42 on the PCB 10 by fine, conductive wires 108 having opposite ends respectively bonded to corresponding ones of the pads on the die and the PCB. Electrical signals are conducted from the die pads 106 through the wires 108 to the pads 42 on the PCB, and thence, through the PCB by "vias," i.e., plated-through apertures in the PCB, to lands 46 (FIG. 7) on the lower surface 18 of the PCB. Solder balls 110 are welded on the lands 46 to serve as input/output terminals or heat conducting terminals of the package 100. A monolithic body 112 of an insulative material, e.g., an epoxy resin, is formed over the die 102 and upper surface 16 of the PCB 10 to seal the die and protect it from the environment.

One method by which the exemplary PCB 10 may be made is illustrated sequentially in FIGS. 4–7. The method begins with the provision of a relatively thick first sheet, or layer 12, of a metal to serve as the heat spreader of the PCB. In one embodiment, the layer 12 comprises a 0.25 mm (0.010 in.) thick sheet of pure copper. A plurality of clearance openings 14 is formed in the layer 12 at locations corresponding to the desired locations of "clearance vias," i.e., locations in the finished PCB at which it is desired to conduct an electrical signal from the upper surface 16 of the PCB to its lower surface 18. The clearance openings 14 can be formed by drilling, punching, or printing and etching the metal layer 12 from one or both sides thereof, as in conventional PCB fabrication.

Figure 4:
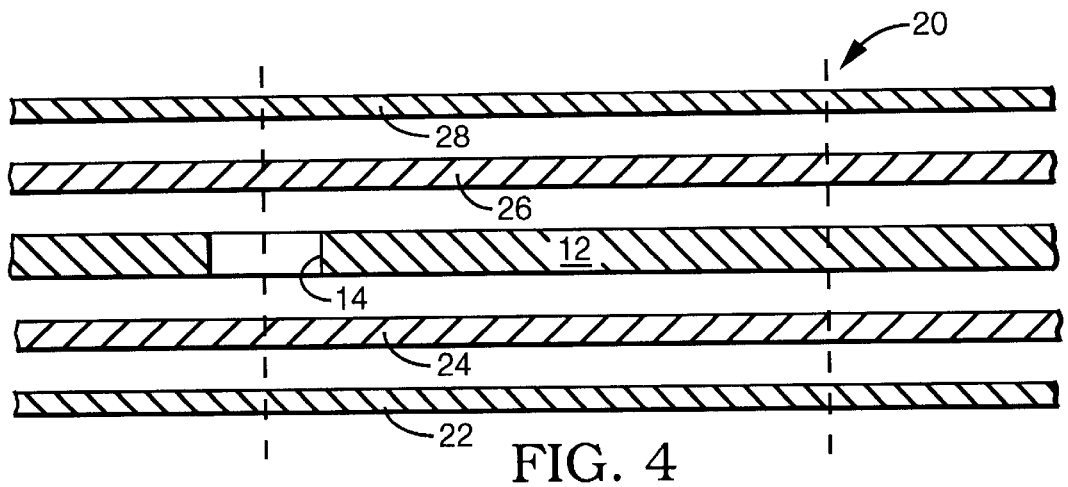
Figure 5:
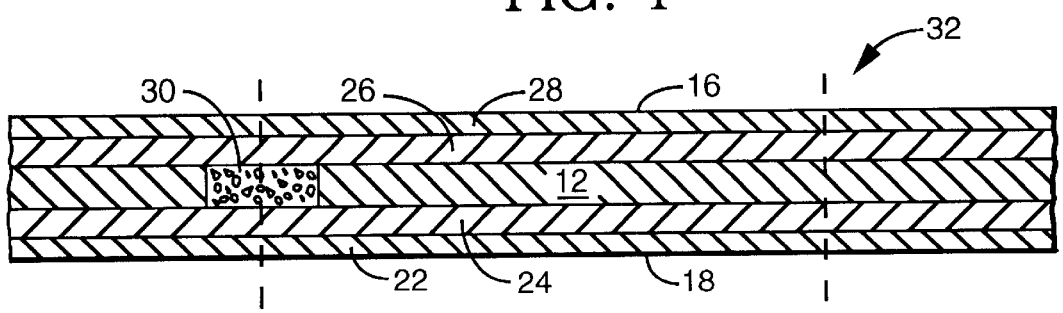

As shown in FIG. 4, a lay-up 20 is formed between the platen of a heated press (not illustrated). The lay-up 20 incorporates as the central layer thereof the first sheet of metal 12 having the clearance openings 14 in it. The lay-up comprises, respectively, a lower layer 22 of a metal, a lower layer 24 of a dielectric material, the central layer of metal 12, an upper layer 26 of a dielectric material, and an upper layer 28 of a metal. In the exemplary embodiment illustrated, the lower and upper layers of metal 22, 28 each comprise a sheet of copper 0.028 mm (0.001 in.) thick. The metal layers may be conventionally treated, such as by etching or pickling, to form asperities or an oxide coating on their respective surfaces to facilitating bonding to them.

The lower and upper layers of dielectric material 24, 26 each comprise a 0.125 mm (0.005 in.) thick sheet of a "composite" of a fibrous insulative material, e.g., fiberglass, that has been impregnated with a soft, partially cured thermosetting resin, e.g., a polyimide resin, an epichloridehydrin bisphenol-A (epoxy) resin, or a bismaleimidetriazine ("BT") resin. Fiberglass sheets pre-impregnated with such resins partially cured to a "B-stage" condition are commercially available in the form of so-called "prepregs" from a wide variety of sources.

While the lay-up 20 of a single exemplary PCB 10 is illustrated in the figures, those of skill in the art will appreciate that substantial economies of production will be realized if a large number of identical PCBs are simultaneously laid up in the form of a large, interconnected array thereof. Additional economies will be realized if several such arrays are laid up on top of each other between the platen of the press, like the paces of a book, and separated from each other by a "buffer" layer of, e.g., kraft paper, for simultaneous pressing.

When complete, the lay-up 20 is simultaneously compressed and heated by the platen of the press. The pressure on the lay-up squeezes the soft, partially-cured resin from the dielectric layers 24, 26, like water from a sponge, and forces it into the clearance openings 14 in the central layer of metal 12, and to the respective surfaces of the dielectric layers, where it wets the opposing surfaces of the respective layers of metal 22, 12 and 28. The heat of the press then cures the resin such that a solid resin insulator 30 is formed in each of the clearance openings 14, and the respective layers of the lay-up are adhered to each other in a rigid, integral laminate 32, as shown in cross-section in FIG. 5.

Figure 6:
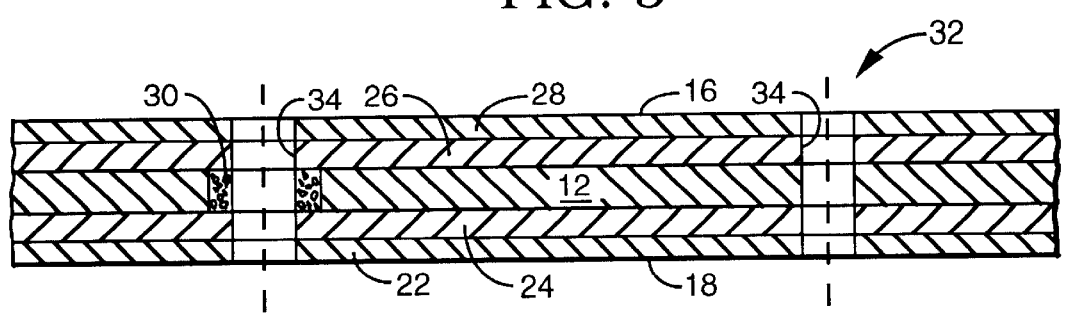
Figure 7:
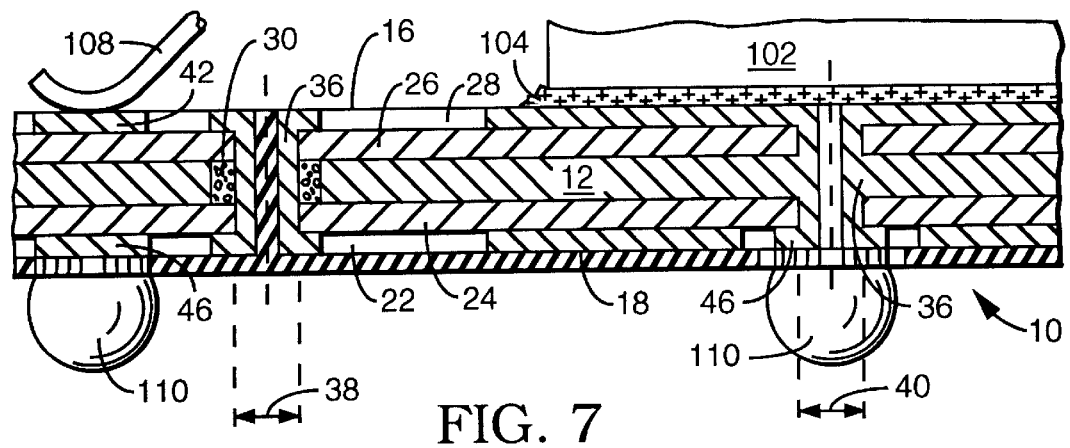

When the laminate 32 is cured, it is removed from the press and, as shown in FIG. 6, a plurality of apertures 34 is formed through the laminate, e.g., by a numerically controlled ("NC") drilling apparatus. The interior walls of each aperture 34 are then plated with a layer 36 of a metal, e.g., copper, using conventional plating techniques to form an electrically and thermally conductive "via" in the laminate 32, i.e., a continuous metal path through the aperture 34 between the upper layer 28 and the lower layer 22 of metal. The "clearance vias" 38 are created by forming selected ones of the apertures 34 at locations corresponding to those of the clearance openings 14, such that the central layer 12 of metal is electrically isolated from the metal paths through the apertures 34 by the resin insulators 30 in the clearance openings, as shown in FIG. 7.

The remaining apertures 34 are formed at locations other than those of the clearance openings 14, such that the thermal spreader, i.e., the central layer 12 of metal, is integrally connected to the metal paths through the apertures. These latter apertures 34 thus function as "thermal vias" 40, i.e., locations in the finished PCB where it is desired to conduct heat from the upper layer 28 of metal to the central layer 12. The central layer 12 then spreads the heat throughout the length and breadth of the PCB 10, and thence, to the lower layer 22 of metal, where it can be conducted by, e.g., a solder ball 110, into a heat-sinking "main board" (not illustrated) to which the package 100 is mounted. In FIG. 7, the thermal via 40 is shown formed immediately below the die 102 for the direct conduction of heat from the bottom of the die into the heat spreading central layer 12.

In the exemplary embodiment illustrated, the clearance openings 14 have a diameter of about 0.450 mm (0.018 in.), and the apertures 34 have a diameter of about 0.250 mm (0.10 in.). The thermal vias 40 can be spaced at a pitch as small as about 0.450–0.500 mm (0.018–0.020 in.). A typical square PGBA-, PLGA-, or PLCC-type package incorporating the PCB 10 may be about 0.23 mm (0.010 in.) or longer on a side.

The thermally enhanced PCB 10 is thus entirely fabricated using only conventional PCB fabrication methods, without the need for costly additional and/or non-conventional components or processes. Accordingly, it is also amenable to the incorporation of other conventional PCB features, such as those shown in FIGS. 1, 2 and 7, including wire bonding pads 42 formed on the upper surface 16, solder ball attachment lands 44 formed on the lower surface 18, a solder mask 46 formed on either or both of the upper and lower surfaces, and platings of gold and/or nickel on the pads 42 and/or the lands 46.

Those skilled in the art will recognize that many substitutions, modifications, and variations can be made in the methods and materials of the present invention without departing from its spirit. For example, the central metal layer 12 can, with suitable modification to the layout of the PCB 10, be made to function as an electrical ground plane rather than or as well as a thermal spreader. Accordingly, the scope of the invention should not be defined by that of the particular exemplary embodiments of it illustrated and described herein, but rather, by that of the claims appended hereafter.

What is claimed is:

1. A method for making a printed circuit board, the method comprising:

forming one or more first openings through a first layer of a metal at selected locations therein;

forming a lay-up respectively comprising a second layer of a metal, a first layer of a dielectric material, the first layer of metal, a second layer of a dielectric material, and a third layer of a metal;

filling the one or more first openings with an electrically insulating material, wherein the electrically insulating material originates from within one or both of the first and second dielectric layers; and, adhering opposing surfaces of the respective layers of the lay-up to each other to form an integral laminate thereof.

2. The method of claim 1, wherein the one or more first openings are filled with the electrically insulating material simultaneously with the adhering of the layers of the lay-up to each other.

3. The method of claim 1, further comprising:

forming at least one second opening through the electrically insulating material in one of the one or more first openings; and, electrically connecting the second and third metal layers to each other through the at least one second opening such that the first metal layer is electrically isolated from the second and third metal layers by the electrically insulating material in the one first opening.

4. The method of claim 1, further comprising:

forming at least one third opening through the laminate at a position displaced from the one or more first openings; and, electrically connecting the first, second, and third metal layers to each other through the at least one third opening.

5. The method of claim 1, wherein the dielectric layers comprise a composite of a fibrous dielectric material impregnated with a thermosetting resin, and further comprising:

pressing the lay-up between the platen of a press to force the resin to the respective surfaces of the dielectric layers and into the one or more first openings; and, curing the resin to solidify it.

6. The method of claim 1, further comprising forming asperities on the metal layers prior to forming the lay-up.

7. The method of claim 1, further comprising forming a pattern in the second and third metal layers.

8. The method of claim 7, further comprising forming a solder mask on at least one of the second and third layers of metal.

9. A printed circuit board, comprising:

a laminate of first, second, and third layers of a metal interleaved with first and second layers of a dielectric material, the second layer of metal having one or more first openings through it, each of the one or more first openings being filled with an electrically insulating material, the laminate having at least one second opening through it that is smaller than a corresponding one of the first openings and located in the substrate such that a peripheral portion of the electrically insulating material in the corresponding first opening circumscribes the second opening and is sandwiched between the first and second layers of dielectric material and the first and third layers of metal, and the laminate having at least one third opening through it at a position displaced from the one or more first openings, wherein the first, second, and third metal layers are electrically connected to each other through the at least one third opening; and, a metal lining in the at least one second opening connecting the first and third layers of metal and overlying the electrically insulating material.

10. The printed circuit board of claim 9, wherein the dielectric layers comprise a composite of a fibrous dielectric material impregnated with a thermosetting resin.

11. The printed circuit board of claim 9, wherein the electrically insulating material filling the one or more first openings comprises a thermosetting resin.

12. The printed circuit board of claim 9, wherein the first and third metal layers are patterned.

13. The printed circuit board of claim 12, further comprising a semiconductor die electrically coupled to the first circuit pattern.

14. The printed circuit board of claim 9, further comprising a solder mask on at least one of the first and third metal layers.

15. A method for making a printed circuit board, the method comprising:

forming one or more first openings through a first layer of a metal at selected locations therein;

forming a lay-up comprising the first layer of metal sandwiched between first and second layers of a dielectric material and second and third layers of a metal, respectively;

filling the one or more first openings with an electrically insulating material; and, adhering opposing surfaces of the respective layers of the lay-up to each other to form an integral laminate thereof, wherein the one or more first openings are filled with the electrically insulating material simultaneously with the adhering of the layers of the lay-up to each other.

16. The method of claim 15, further comprising:

forming at least one second opening through the electrically insulating material in one of the one or more first openings; and, electrically connecting the second and third metal layers to each other through the at least one second opening such that the first metal layer is electrically isolated from the second and third metal layers by the electrically insulating material in the one first opening.

17. The method of claim 15, further comprising:

forming at least one third opening through the laminate at a position displaced from the one or more first openings; and, electrically connecting the first, second, and third metal layers to each other through the at least one third opening.

18. The method of claim 15, wherein the dielectric layers comprise a composite of a fibrous dielectric material impregnated with a thermosetting resin, and further comprising:

pressing the lay-up between the platen of a press to force the resin to the respective surfaces of the dielectric layers and into the one or more first openings; and, curing the resin to solidify it.

19. The method of claim 15, further comprising forming a pattern in the second and third metal layers.

20. A printed circuit board, comprising a laminate of first, second, and third metal layers interleaved with first and second dielectric layers, the second metal layer having a first through-opening filled with an electrically insulating material originating from within at least one of the first and second dielectric layers, and the electrically insulating material having a second though-opening lined with an electrically conductive layer connecting the first and third layers of metal.

21. The printed circuit board of claim 20, wherein the laminate has a third through-opening at a position displaced from the first and second through-openings, the third opening being lined with an electrically conductive layer connecting the first, second, and third metal layers.

22. The printed circuit board of claim 20, further comprising a semiconductor die coupled to the printed circuit board.

23. The printed circuit board of claim 22, wherein the laminate has at least one third opening through it at a position displaced from the one or more first openings, and wherein the first, second, and third metal layers are electrically connected to each other through the at least one third opening, said third opening superimposed by the semiconductor die.

24. A printed circuit board comprising:
   a laminate of first, second, and third layers of a metal interleaved with first and second layers of a dielectric material, the second layer of metal having one or more first openings through it, the laminate having at least one third opening through it at a position displaced from the one or more first openings, wherein the first, second, and third metal layers are electrically connected to each other through the at least one third opening, said third opening being superimposed by the semiconductor die, and each of the one or more first openings is lined with a ring of an electrically insulating material that is located only between the first and second dielectric layers; and,
   an electrically conductive layer extending through the ring of the electrically insulating material and connecting the first and third metal layers.

25. The printed circuit board of claim 24, further comprising a semiconductor die to the printed circuit board.

* * * * *

UNITED STATES PATENT AND TRADEMARK OFFICE
CERTIFICATE OF CORRECTION

PATENT NO.    : 6,448,509 B1
DATED         : September 10, 2002
INVENTOR(S)   : Huemoeller It is certified that error appears in the above-identified patent and that said Letters Patent is hereby corrected as shown below:

Column 1,
Line 36, delete "®" and insert -- © --;

Column 3,
Line 65, delete "paces" and insert -- pages --; and

Column 8,
Line 22, after "the" insert -- coupled --.

Signed and Sealed this

Eighteenth Day of March, 2003

JAMES E. ROGAN
*Director of the United States Patent and Trademark Office*